United States Patent [19]

Conway et al.

[11] Patent Number: 4,625,177
[45] Date of Patent: Nov. 25, 1986

[54] COMPLEX MICROWAVE SIGNAL GENERATOR

[75] Inventors: Larry J. Conway, Kanata; William D. Cornish, Nepean, both of Canada

[73] Assignee: Her Majesty the Queen in Right of Canada, Ontario, Canada

[21] Appl. No.: 658,681

[22] Filed: Oct. 9, 1984

[30] Foreign Application Priority Data

Feb. 20, 1984 [CH] Switzerland .................. 448,079

[51] Int. Cl.[4] .................. G11C 27/02; H03B 21/00; H03K 3/86
[52] U.S. Cl. .................. 328/187; 328/55; 328/14; 328/61
[58] Field of Search .................. 328/55, 56, 178, 187, 328/14, 15, 61; 377/42

[56] References Cited
U.S. PATENT DOCUMENTS 3,783,247  1/1974  Klein et al. .................. 377/42
3,792,195  2/1974  Wilson et al. ................. 328/187
3,952,189  4/1976  Fabricius .................... 328/14
4,003,003  1/1977  Haeberlin ................... 328/14
4,061,909  12/1977 Bryant ...................... 328/14
4,359,690  11/1982 Tucker et al. ................ 328/56
4,437,066  3/1984  Gordon ..................... 328/14

Primary Examiner—John S. Heyman
Attorney, Agent, or Firm—Stevens, Davis, Miller & Mosher

[57] ABSTRACT

A method and apparatus for generating complex microwave signals in which microwave signals are directly generated by the simultaneous application of a number of analog voltages to points distributed along a transmission line. These signals may be generated by a digital computer or other means and may be altered in phase, frequency and amplitude by simply varying the relative levels of the analog voltages applied along the transmission line, thus allowing very complex microwave waveforms to be generated.

6 Claims, 11 Drawing Figures

COMPLEX MICROWAVE SIGNAL GENERATOR

This invention relates to signal generators and more particularly to complex radio frequency (r.f.) signal generators.

Complex r.f. signals may vary in frequency, phase and amplitude instantaneously over very wide r.f. bands.

The prior art generated r.f. signals by utilizing a voltage controlled oscillator (VCO) which relied on an analog voltage to change the output frequency. The output of a VCO would be controlled by a digital word on a stream of data bits. A digital to analog converter (D/A), transformed the digital word on a stream of bits into an analog voltage and a linearizer removed the non-linear tuning characteristics of the VCO. The D/A converter and linearizer were combined to provide a linear digitally tuned VCO system.

Another method used in the prior art to obtain complex r.f. signals is the microwave frequency synthesizer which relied on a combination of frequency multiplication, division and mixing of a reference oscillation.

Although the VCO approach is moderate in cost and complexity, it has a number of limitations. In addition to its inability to change its frequency instantaneously (in the nanosecond regime), linearity, post-tuning drift and frequency accuracy and its mobility to provide changes in phase present drawbacks.

The microwave frequency synthesizer also has drawbacks in that switching time between any two frequencies is dependent upon the response time of a switch matrix and is generally of the order of 100 usec. Additionally phase switching is not possible. Moroover, the multiplication to microwave frequencies also causes degradation in phase noise performance.

The applicants resolved the problems associated with the prior art by inventing a complex signal generator in which microwave signals are directly generated by the simultaneous application of a number of dc voltages to points distributed along a transmission line. The dc voltages may be generated by a digital computer or by other means. The microwave signal can be altered in phase, frequency and amplitude by simply changing the relative levels of the dc voltages applied along the transmission line, thus allowing very complex microwave waveforms to be generated. The applicant takes advantage of the distributed sampling concept described in Canadian Pat. No. 1,135,342, equivalent to U.S. Pat. No. 4,359,690, naming T. W. Tucker, L. J. Conway and S. L. Bouchard as inventors.

It is therefore an object of the invention to provide a method of generating complex r.f. signals comprising the steps of:

sending a number of input signals from generator means to a number of sampling means, said sampling means being connected to a number of predetermined points along delay line means;

initiating said sampling means to allow samples of said input signals to be transferred at predetermined time intervals to said delay line means; and combining said samples at said delay line means in a time series manner to form a complex signal having predetermined variations of frequency, phase and amplitude.

Another object of this invention is to provide an apparatus for generating r.f. signals having:

generator means for sending a number of input signals to a number of sampling means, said sampling means being connected to a number of predetermined points along delay line means;

control means for initiating said sampling means to allow samples of said input signals to be transferred at predetermined time intervals to said delay line means such that said samples are combined in a time series manner to form a complex signal having predetermined variations of frequency, phase and amplitude.

Particular embodiments of the invention will be described in conjunction with the following drawings in which.

Figure 1:
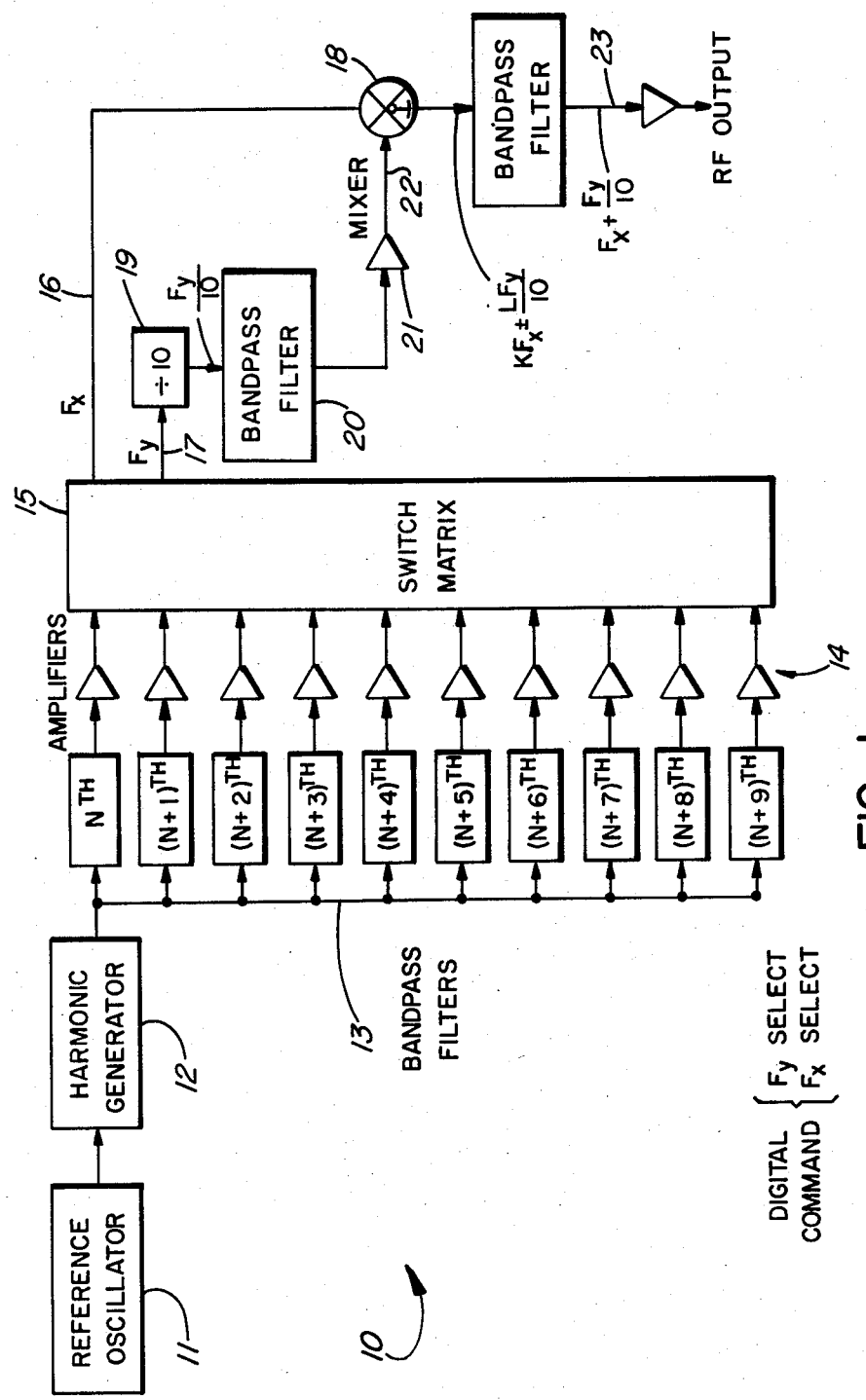
FIG. 1 is a block diagram of a basic direct synthesizer used in the prior art.

Referring now to FIG. 1, shown generally at reference numeral 10 is a block diagram of a basic direct frequency synthesizer used in the prior art. Multiples of the reference oscillator frequency 11 are generated in a harmonic generator 12 and are then selected by individual band-pass filters 13, followed by amplifiers 14.

In this example, a set of ten harmonics is selected from the $N^{th}$ to the $(N+9)^{th}$. The ten frequencies—all harmonics of the reference oscillation—are fed into a switch matrix 15.

Switch matrix output frequencies, Fx at 16 and Fy at 17, are selected by two logic word inputs (not shown) to the matrix 15.

The Fx frequency output 16 is selected by the first frequency select word and is fed directly to a mixer 18. The Fy frequency output 17 is first divided by 10 at 19, filtered at 20, amplified at 21 and then fed into the mixer's second input port 22. The mixer's output port 23 provides the synthesizer output Fx+Fy/10, which may be equal to any one of 100 programmable frequencies.

This scheme may be expanded to produce larger numbers of programmable frequencies. To generate frequencies in the microwave range, direct synthesis is normally performed at lower frequencies, as in FIG. 1, and then multiplied or up-converted.

Figure 2A:
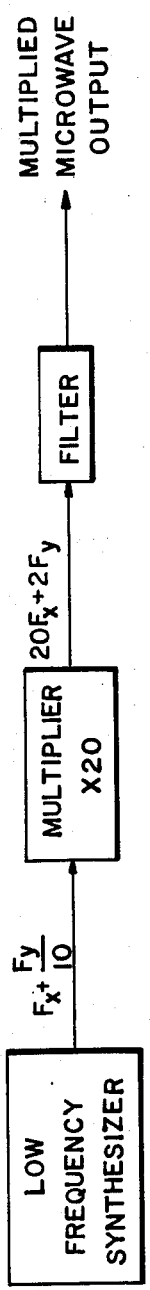
FIGS. 2a and 2b are block diagrams of other embodiments for directly synthesized microwave frequency generation used in the prior art.
Figure 2B:
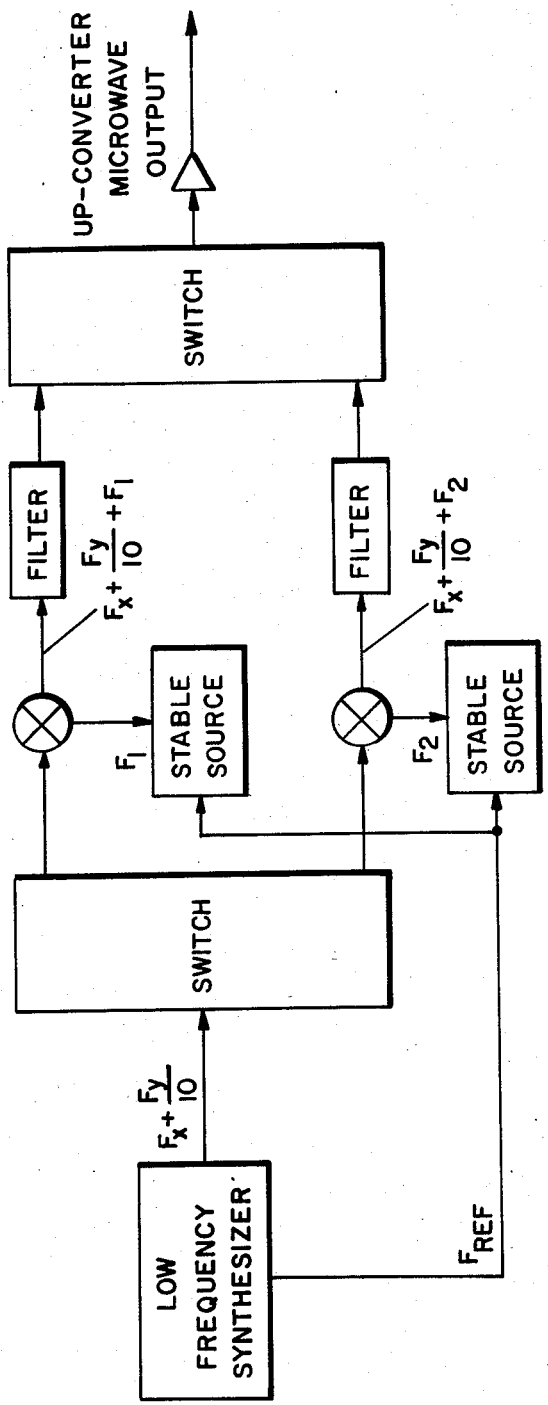

When the output range is relatively narrow, a single multiplication is easier, and usually the preferred method. This is shown in FIG. 2a. In order to cover wide frequency ranges, however, up-conversion by mixing against stable single-frequency microwave signals is usually employed, as shown in FIG. 2b.

These single-frequency stable signals are also derived from the basic reference oscillation. Either method, or a combination of both, will preserve the fast switching speed of the direct synthesizer, but with increased complexity, size and cost.

Figure 3:
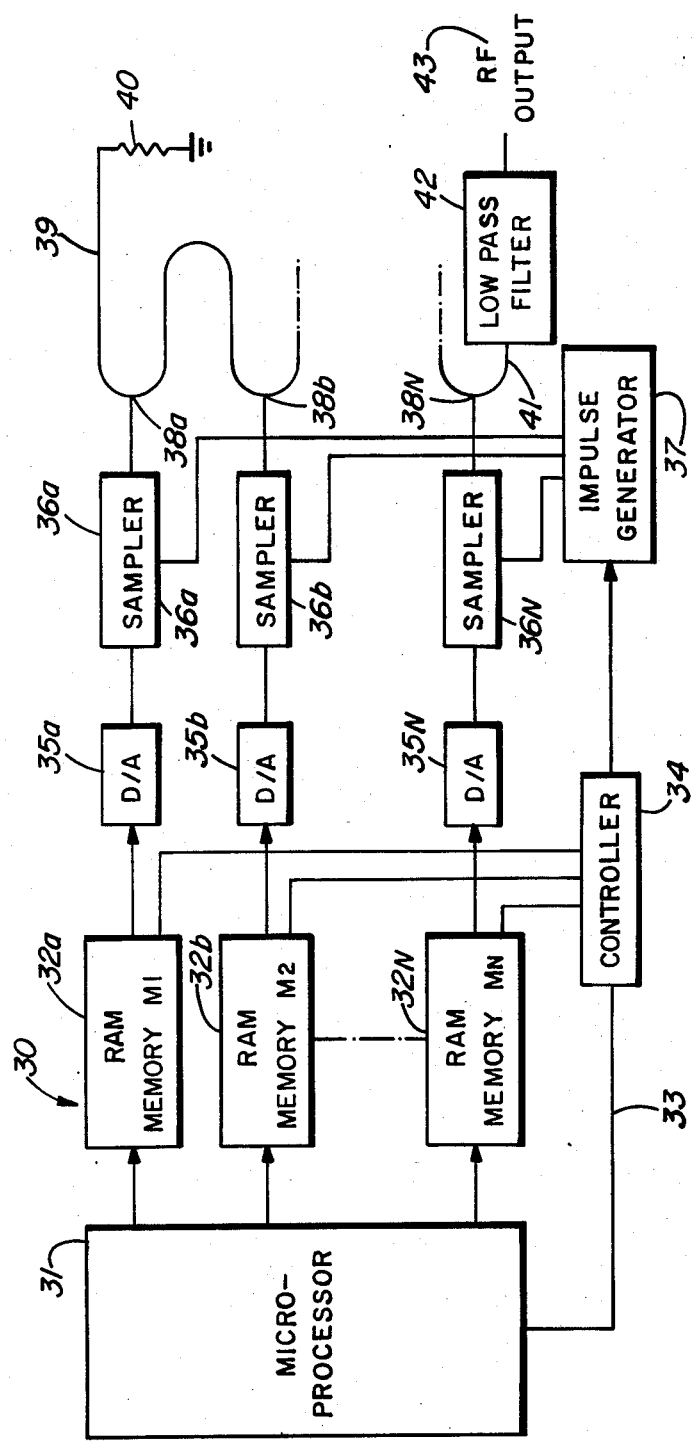
FIG. 3 is a block diagram of a complex microwave signal generator used in the present invention.

Referring now to FIG. 3, shown at reference numeral 30 is an embodiment of a complex microwave signal generation for the present invention.

In this embodiment a microprocessor 31 is used to generate the desired waveform(s). With the waveforms being described mathematically the microprocessor 31 computes the sample values of a particular waveform at specified intervals. This procedure is well known in the art and need not be discussed in greater detail. The waveform values obtained are digital words or bit streams and may either be stored in a mass storage memory (internal to the processor) and then transferred to the fast RAM memories 32a to 32N or may be transferred directly to the fast RAM memories. These RAM memories have address locations 1 to P. The first waveform value is transferred from the microprocessor 31 to the first address location of memory M1 shown at 32a. The second waveform value is transferred to the first address location of memory M2 at 32b and so on.

After N waveform values corresponding to the N memory channels have been transferred, the N+1 waveform value is stored in the second address location of first memory M1 at 32a. The N+2 waveform value is stored in the second address location of second memory M2 at 32b and so on. This procedure is repeated until all waveform values have been stored in the fast RAM memories 32a to 32N.

Once the fast RAM memories 32a to 32N are loaded, the microprocessor 31 initiates a first sample control signal activating the controller 34. Once initiated the controller 34 outputs the first address location of each of the RAM memories 32a to 32N. The contents of the first address location of each of the RAM memories 32a to 32N are read out and passed on to their respective D/A converters 35a to 35N. The contents of the address of the RAM memories 32a to 32N are digital words or bit streams which represent predetermined voltage levels mathematically calculated by microprocessor 31 and necessary to generate complex microwave signals. The D/A converters 35a to 35N subsequently convert their digital inputs to analog output voltages.

These analog voltages are then applied to the inputs of an equal number of sampling gates 36a to 36N. Once the D/A converters 35a to 35N have settled the controller 34 initiates a command which triggers an impulse generator 37. The impulse generator 37 in turn activates the sampling gates 36a to 36N for a brief period of time. This then allows the analog voltages at each of the sampling gates 36a to 36N to be transferred to their respective outputs 38a to 38n. At this time the sampled analog voltages are applied to a meander delay line 39 which combines the samples in a time series manner allowing construction of a signal. The constructed signal propagates in both directions on the meander delay line where it is terminated at one end 40 and is transmitted at the other 41. A low pass filter 42 at the output 41 can be used to filter out high frequency components resulting from the sampling process. A complex microwave signal is then obtained at output 43.

The process of reading from the RAM memories 32a to 32N, D/A converting and sampling is then repeated. However in this case the contents of the second address location of each RAM memories 32a to 32N are read.

All address locations will be successively read, converted and sampled until otherwise indicated by the controller 34. The controller 34 may elect to read from the address locations 1 through P over and over, indefinitely or may elect to stop at any address locations. In fact the controller 34 may elect to start and/or stop at any predetermined address location thus providing maximum flexibility.

This process allows for the generation of a signal over a time period equal to the delay time of the meander delay line 39. Successive application of digital words to D/A 35a to 35N and sampling allows the generation of a signal over any number of time periods.

The above description represents one of many ways of generating output voltages which can subsequently be recombined to generate a complex microwave signal. It will therefore be understood by those knowledgeable in this art that other voltage generating means can be used in this invention. For example, although the above description is based on obtaining generated signals from a programming function (i.e., microprocessor), desired waveforms may be permanently stored in read only memories (ROM). Thus the fast RAM memories 32a to 32N can be substituted for ROM memories in this case.

The time delay between successive sampling tap points 38a, 38b... 38N on the meander delay line determines the upper frequency for which signals may be generated. If this time delay is ($t_p$) then the upper frequency limited ($f_c$) is given by $$f_c = 1/2t_p \qquad \text{(equation 1.0)}$$

The number of sampling gates required to generate continuous signals will be dictated by the upper frequency of the D/A devices ($f_d$) and the delay between successive taps ($t_p$) and is given by $$N = 1/f_d t_p \qquad \text{(equation 2.0)}$$

or $$N = 2f_c/f_d \qquad \text{(equation 3.0)}$$

As an example, for the generation of signals to 2 GHz and given $f_d = 200$ MHz, then taking equation 3.0

$$N = \frac{2(2 \times 10^9)}{200 \times 10^6} = 20 \text{ sampling gates required.}$$

For $f_c = 5$ GHz and $f_d = 200$ MHz then the number of sampling gates required N is equal to 50.

Figure 4A:
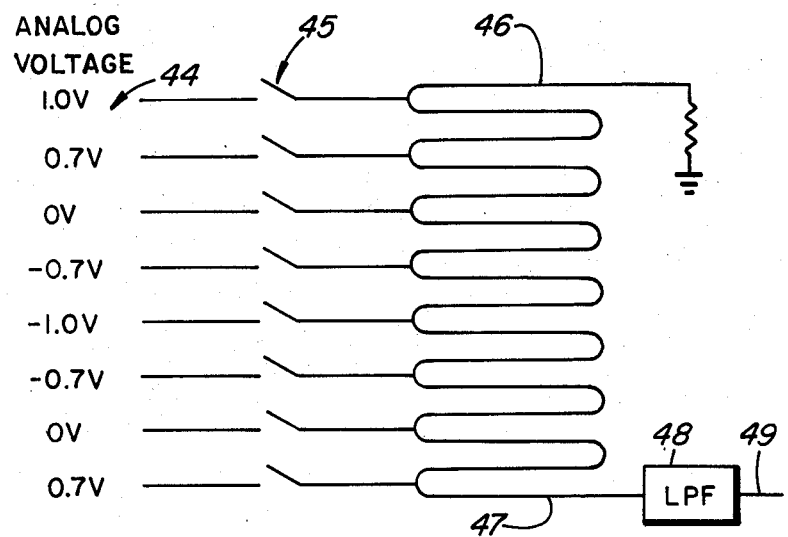
FIGS. 4a, 4b and 4c show an example of sinewave generation using the present invention.
Figure 4B:
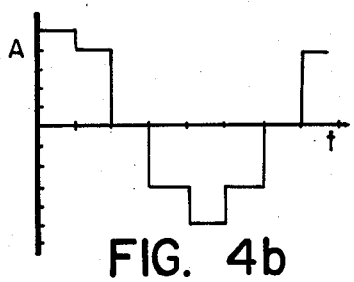
Figure 4C:
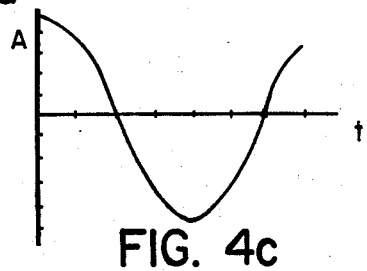

FIGS. 4a, 4b and 4c are step by step representations for the generation of one sinewave cycle. When preset analog voltages 44 are applied through sampling gates 45 to a meander delay line 46 a signal is constructed in a time series manner. This signal has the form shown in FIG. 4b when observed at the end 47 of the meander delay line 46.

When the signal is passed through a low pass filter 48 the high frequency components of the waveform are removed resulting in the waveform shown in FIG. 4c when observed at 49. Clearly, then, the continuous sampling of the sampling gates 45 at a time equal to the delay time of the meander delay line 46 will allow the generation of time continuous signals.

In addition, by varying the relative voltages 44 applied to the sampling gates 45 an infinite number of signals may be generated which vary in frequency, phase and/or amplitude.

Figure 5A:
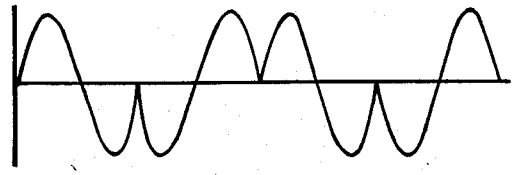
FIGS. 5a, 5b and 5c are examples of the type of signals which may be generated by the present invention.
Figure 5B:
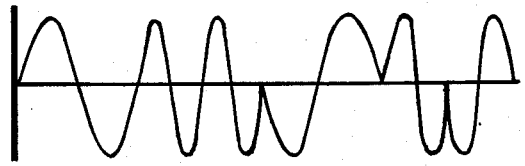
Figure 5C:
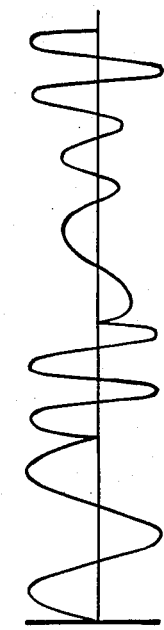

As an illustration, FIGS. 5a, 5b and 5c depict possible signals which may be generated by this process.

FIG. 5a shows a signal having a constant amplitude and frequency but wherein the phase is varied. FIG. 5b illustrates a signal which has a constant amplitude but is varied in frequency and phase. FIG. 5c illustrates a signal with a varied amplitude, frequency and phase.

The approach thus far has presented a scheme which is very flexible and where the required output may be programmed. However, for specific applications it is clear that alterations to the control and D/A subsystems are possible.

Figure 6:
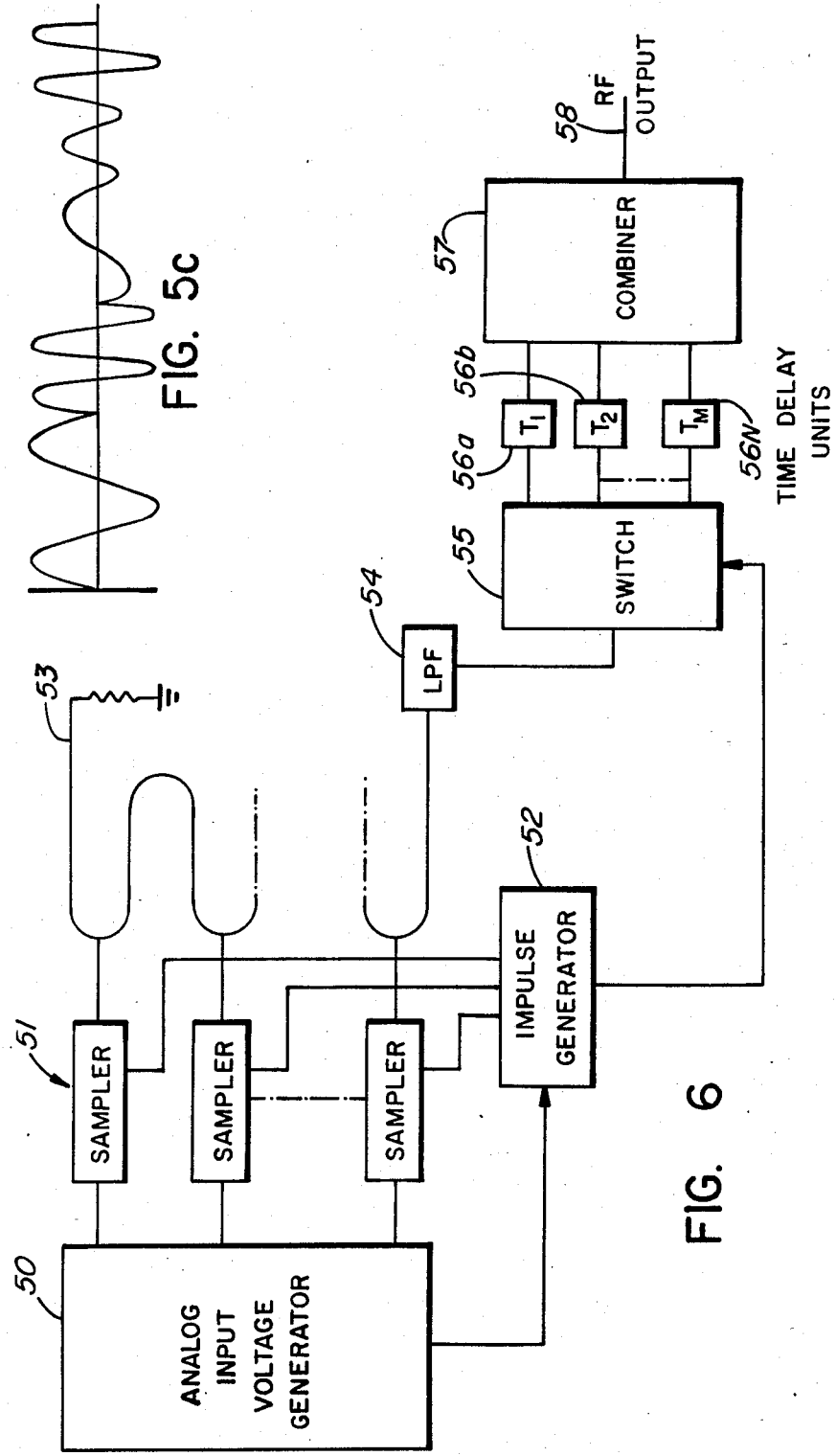
FIG. 6 is another embodiment of the complex microwave signal generation used in the present invention.

Equally, for pulsed signals, other types of circuitry are possible without increasing the number of parallel sampling channels. One such example is shown in FIG. 6. FIG. 6 shows another embodiment of a complex microwave signal generator. The microprocessor 31, memories 32a to 32N, controller 34 and D/A converters 35a to 35N of FIG. 3 have been replaced by an analog input voltage generator 50 which will provide input voltages to samplers 51. In this embodiment, passive time delay units 56a to 56N are used in combination with a switch 55 placed after the low pass filter 54 and a combiner unit 57. In this process, segments of the signals generated at times equal to the switching time $T_i$ of the impulse generator 52 are appropriately switched to specified time delay units 56a to 56N and combined at the output through a combiner 57. In order to illustrate this concept, one can assume, for example, that three segments of signal content are to be generated. Each segment has a total pulse width equal to the delay line's delay time $T_d$. When the first segment is generated, by applying analog inputs 50 and sampling these inputs at 51 onto the meander delay line 53, switch 55 is switched to time delay unit $T_1$ at 56a. Time delay unit $T_1$ has a time delay equal to $2(T_i - T_d)$. When the second segment is generated, switch 55 switches to time delay unit $T_2$ at 56b.

This generated segment is subsequently delayed by a time delay equal to $T_i - T_d$. When the third and last segment is generated, switch 55 switches to time delay unit $T_3$ which has no associated time delay. Finally, the three segments are combined by the combiner unit 57 and transmitted at the output 58. Although an analog input voltage generator has been used, the microprocessor, RAM memory and D/A converter configuration of FIG. 3 can also be used.

The general operation of the impulse generator and sample circuits have been described in detail in the previously referenced patent No. 1,135,342 and need not be discussed any further.

The above-described invention demonstrates two specific embodiments. Many other circuit arrangements are conceivable, however the essence of the invention is the generation of complex microwave signals by the simultaneous application of a number of dc voltages to points distributed along a transmission line. The dc voltages may be generated by a computer or by other means. The microwave signal can be altered in phase, frequency and amplitude by simply changing the relative levels of the dc voltages applied along the transmission line, thus allowing very complex microwave waveforms to be generated.

It is thus clear that the present invention can be used as complex r.f. signal generators or in secure encoder/decoder systems for communication systems, by satellites or radars.

A person skilled in the art understanding this invention may now conceive of alternative embodiments or variations thereof. All are considered within the sphere and scope of this invention, as defined in the claims appended hereto.

The embodiments of the invention in which an exclusive property or privilege is claimed are defined as follows:

1. A method of generating complex r.f. signals comprising the steps of:
   sending a number of input signals from signal generating means to a number df sampling means, said sampling means being connected to a number of predetermined points along delay line means;
   initiating said sampling means to allow samples of said input signals to be transferred at predetermined time intervals to said delay line means; and
   combining said samples at said delay line means in a time series manner to form a single complex outout signal which is a combination of said number of input signals, said complex output signal having predetermined variations of frequency, phase and amplitude.

2. A method of generating complex r.f. signals comprising the steps of:
   sending a number of input signals in the form of analog voltages from generator means to a number of sampling means, said sampling being connected to a number of points along output delay line means, said voltages being mathematical representations of said complex signals to be generated;
   initiating said sampling means to allow samples of said analog voltages to be transferred at perdetermined time intervals to said output delay line means;
   combining said samples at said delay line means in a time series manner to form a complex output signal having predetermined variations of frequency, phase and amplitude;
   selecting segments of said complex output signal by means of a switch placed between said output delay line means and a number of time delay means such that said segments are appropriately switched to specified time delay means, said time delay means being further connected to combiner means;
   combining said segments from said time delay means with said combiner means to produce an output pulse signal containing said segments.

3. A method of generating complex r.f. signals as defined in claim 2 comprising the further step of:
   removing high frequency components from said complex signals by filtering means.

4. An apparatus for generating complex r.f. signals comprising:
   generator means for sending a number of input signals in the form of analog voltages to a number of sampling means, said sampling means being connected to a number of points along output delay line means, said voltages being mathematical representations of said complex r.f. signals to be generated;
   control means for initiating said sampling means to allow samples of said analog voltages to be transferred at predetermined time intervals to said output delay line means such that said samples are combined in a time series manner to form a complex signal having predetermined variations of frequency, phase and amplitude;
   switching means placed between said output delay line means and a number of time delay means for selecting segments of said complex signal such that said segments are appropriately switched to a specified time delay means; and
   combining means for combining said segemts received from said time delay means such as to produce an output pulse signal containing said segments.

5. An appartus as defined in claim 4 in which filtering means is used to remove high frequency components from said complex signal.

6. An apparatus for generating complex r.f. signals, comprising:
   generating means for sending a number of input signals in the form of analog voltages to a number of sampling means, said sampling means being connected to a number of points along output delay line means;
   control means for initiating said sampling means to allow samples of said analog voltages to be transferred at predetermined time intervals to said output delay line means to form a complex output signal which is a combination of said analog voltages;
   switching means placed between said output delay line means and a number of time delay means for selecting segments of said complex signal, such that said segments are appropriately switched to a specified time delay means; and
   combining means for combining said segments received from said time delay means so as to produce an output pulse signal containing said segments.

* * * * *